United States Patent [19]

Amick

[11] 4,301,322
[45] Nov. 17, 1981

[54] SOLAR CELL WITH CORRUGATED BUS

[75] Inventor: James A. Amick, Princeton, N.J.

[73] Assignee: Exxon Research & Engineering Co., Florham Park, N.J.

[21] Appl. No.: 136,947

[22] Filed: Apr. 3, 1980

[51] Int. Cl.³ .............................................. H01L 31/04
[52] U.S. Cl. .................................... 136/256; 357/65; 357/68
[58] Field of Search ........... 136/89 CC, 89 P, 89 EP, 136/256; 357/65, 68

[56] References Cited

U.S. PATENT DOCUMENTS

| | | | |
|---|---|---|---|
| 2,820,841 | 1/1958 | Carlson et al. | 136/89 |
| 3,502,507 | 3/1970 | Mann | 136/89 |
| 3,976,508 | 8/1976 | Mlavsky | 136/89 |
| 3,982,964 | 9/1976 | Lindmayer et al. | 136/89 |
| 4,082,569 | 4/1978 | Evans, Jr. | 136/89 CC |
| 4,153,476 | 5/1979 | Shelpuk | 136/89 PC |
| 4,203,646 | 5/1980 | Desso et al. | 339/205 |

FOREIGN PATENT DOCUMENTS 2295574  8/1976  France ........................ 136/89 CC

OTHER PUBLICATIONS

Arcopower Solar Modules-2000 Series, Arco Solar, Inc., Product Literature, Mar. 1979.

Primary Examiner—Aaron Weisstuch
Attorney, Agent, or Firm—Paul E. Purwin

[57] ABSTRACT

The invention teaches an improved bus for current collection in photovoltaic solar cells. The bus is prefabricated from a highly conductive metal and is corrugated to compensate for differences in thermal coefficients of expansion between the bus and the solar cell body.

23 Claims, 8 Drawing Figures

SOLAR CELL WITH CORRUGATED BUS

BACKGROUND OF THE INVENTION

1. Field of the Invention

The present invention relates to solar cells and more particularly to current carrying bus configurations used to improve the efficiency of solar cells.

Current collection from the illuminated surface of a solar cell is conventionally provided by a solder-dip formed grid having collection grid lines extending across a majority of the cell's surface. A number of alternate patterns may be used. Typically, one or more bus lines interconnect the grid and form a common collection point for connecting the cell to an external circuit. The proper design of the collection grid and the accompanying bus is important to the solar cell's efficiency.

This design requires that the photosensitive surface area covered by metal, and hence shadowed from incident light, be small. On the other hand, the conductivity of the grid and bus(es) must be sufficiently high to minimize power ($I^2R$) dissipation losses in the collecting network. For any metal sheet conductance, there will be an optimum metal pattern for which the sum of the shadowing and $I^2R$ losses are minimal. This represents the most favorable grid/bus pattern for that solar cell. Increasing the sheet conductivity of the bus metal allows the width of the bus(es) to be decreased without increasing the $I^2R$ dissipation loss, and hence represents a more nearly optimum collecting network. In theory, the sheet conductivity can be increased by either increasing the metal thickness, or by employing a metal having a higher intrinsic conductivity. Increasing the metal thickness can be achieved up to a point, but then becomes impractical either because of constraints imposed by the metallization method, or by mismatch in the expansion coefficients of the metal and the underlying solar cell.

A common obstacle to obtaining high sheet conductivity collection grids and busses is the requirement that the thermal coefficients of expansion for the metal used in forming the network and the underlying cell be sufficiently compatible. For instance, single crystal silicon solar cells have linear thermal coefficients of expansion of about $2 \times 10^{-6°}$ C.$^{-1}$ for temperatures ranging from 0° C. to 50° C. and about $2.4 \times 10^{-6°}$ C.$^{-1}$ for temperatures ranging from 50° C. to about 100° C. Typical low cost grid and bus forming techniques utilize lead-tin solder patterns to form the grid/bus network on the cell's surface. Alternatively, screened-on conducting inks are employed, or evaporated metal patterns are used. Lead-tin solders have very high expansion coefficients, typically $20-25 \times 10^{-6°}$ C.$^{-1}$, but are relatively ductile at room temperature. When the solder is cooled below room temperature, however, the solder becomes more rigid and the stress rises. The thicker the solder layer, the more serious the mismatch in expansion coefficient becomes upon thermal cycling.

In the formation of a solar cell by a solder dipping procedure, the thickness of the solder differs from the grid lines to the bus lines, and (if the bus is tapered) from one end of the bus to the other. This solder height is determined in part by surface tension in the solder, and in part by the width of the metal line to which the solder adheres. In a typical solar cell, the thickness of the solder on the bus pattern may be 3 to 5 times the thickness of the solder on the grid line. Accordingly, it is one object of this invention to reduce the solder thickness on the bus pattern without increasing the resistance of the bus. It is another object of this invention to provide a high conductivity metal bus with minimal solder thickness, while retaining solder as the metallization for the grid lines. In this manner, the cells are better able to withstand temperature excursions, particularly to temperatures of −45° C. and below.

The electrical resistivity of lead-tin solders is typically about 10 to 15 times that of copper, depending on the solder composition. For equal thicknesses, the copper will therefore have a sheet conductivity about 10 to 15 times higher than that of the solder. Accordingly, the width of a copper bus can be decreased by 10 to 15 times if its thickness is equal to that of a solder bus, without a change in the $I^2R$ dissipation of the bus and with a substantial gain in the photosensitive area on the surface of the solar cell. Several other common metals, including gold, and silver, also have electrical conductivity about equal to, or better than that of copper.

Pure copper has a linear thermal coefficient of expansion of about $16.6 \times 10^{-6°}$ C.$^{-1}$, which is substantially larger than that of the silicon in the solar cell. Furthermore, the copper used in conductors is typically much stiffer than the lead-tin solder at room temperature. Attaching a copper bus directly to an underlying solder metallized bus pattern on a solar cell along the entire bus length generally leads to peeling of the copper or solder from the silicon surface during thermal cycling. In the past, this problem has been overcome by laminating copper with a low expansion metal alloy such as Invar to provide a "sandwich" having an average expansion coefficient closely matching that of silicon. This approach adds substantially to the cost of the bus bars to be attached to the solar cell. Furthermore, the Invar materials are relatively poor electrical conductors and, for adequate electrical conductivity of the bus, substantial total bus metal thicknesses are required. Accordingly, the expansion coefficients must be very closely matched to avoid delamination with these thick bus materials. Furthermore, shadowing by the bus at other than vertically incident light increases.

The present invention avoids these problems, yet provides an increased electrical conductivity bus for current collection in a solar cell while permitting minimal solder thickness, (or other expansion coefficient mismatched metal bus thickness,) on the solar cell surface. The increased sheet conductivity for the bus permits redesign of the bus pattern and provides for increased output from a given solar cell wafer. The invention further provides for inter-cell electrical connections needed for assembly of cells into "strings." It also further provides a spacer between the front surface of the solar cell and a superstrate such as glass, which may have advantage when, for instance, silicone elastomers are used as pottants. Since the expansion coefficient of silicon and glass differ, it is important to separate the silicon from the glass by a predetermined amount in the finished module so that the difference in expansion can be accommodated in the soft elastomer layer which bonds the cells to the glass.

PRIOR ART

The problem of thermal expansion mismatching of solar panel components was recognized by those of the art preparing solar generation systems for space vehicles. For example, in U.S. Pat. No. 3,976,508, Mlavsky teaches a flexible interconnect between segments of solar panels to prevent severance of the inter-segment wiring due to thermal expansion and contraction. Others of the art have recognized that a metallic bus bar, added to the collection grid, increases the current collecting ability of the grid/bus network. For example, in U.S. Pat. No. 4,082,569, Evans teaches incorporating a metallic grid within a conductive oxide to serve as a current collector for a solar cell. A further example of a pre-fabricated metallic supplement to a solar cell's collection grid is found in U.S. Pat. No. 4,153,476. These teachings, however, do not address the problem of thermal expansion mismatch between the current collection network and solar cell body. In contrast, the present invention provides a prefabricated high electrical conductivity corrugated bus which both increases the current collection efficiency and provides compensation for differences in thermal coefficients of expansion between the solar cell body and the power carrying bus connected thereto.

The present invention further provides an integral inter-cell electrical connector. In U.S. Pat. No. 3,502,507, Mann teaches a solar cell having wrap-around electrodes which may serve to interconnect cells.

SUMMARY OF THE INVENTION

The present invention teaches an improved electrical bus for current collection in solar cells. The bus is prefabricated from a highly electrically conductive metal such as copper. The prefabricated bus is corrugated to provide stress relief when secured to the solar cell's surface, thereby compensating for differences in thermal coefficients of expansion between the bus and the solar cell body. The invention minimizes bus electrical losses, and enhances the solar cell's efficiency. The prefabricated bus further provides and integral inter-cell electrical connector, facilitating solar cell panel assembly.

BRIEF DESCRIPTION OF THE DRAWINGS

In the drawings, where identical components are commonly designated.

DETAILED DESCRIPTION OF THE INVENTION

Figure 1:
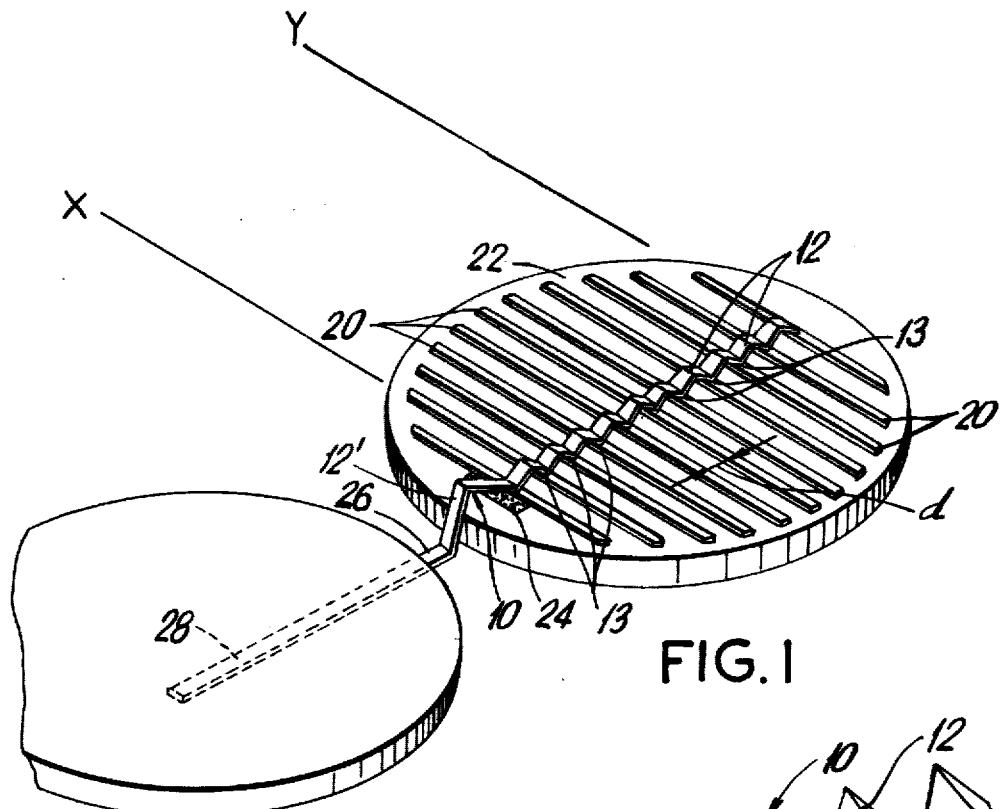
FIG. 1 is a view in perspective of a solar cell having a corrugated bus.
Figure 1A:
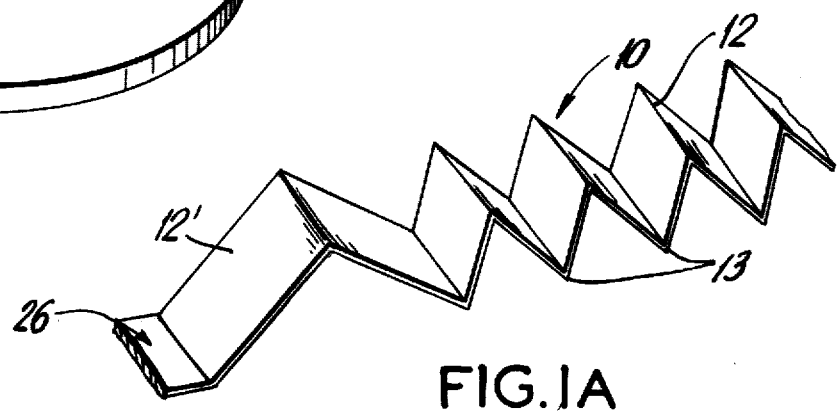
FIG. 1a is an exploded view in perspective of the bus segment of FIG. 1.

The present invention teaches a corrugated bus, prefabricated from a conductive metal such as copper and incorporated into a current collecting grid network for a solar cell. To illustrate this invention, FIG. 1, and accompanying FIG. 1a which is an exploded view of the bus segment of FIG. 1, are perspective views of one embodiment of the present invention. Referring to FIG. 1a, a bus 10 having a plurality of corrugations 12 along the major length of the bus is fabricated from a high electrical conductivity metal such as copper, gold, silver or the like. The metal is generally in the form of foil, ribbon or the like, having sufficient ductility to both form the requisite corrugations and to allow sufficient flexibility between corrugation valleys 13 to provide thermal expansion compensation when embodied in the current collection grid network shown in FIG. 1. The corrugations may be formed in the bus material by several alternate means such as die stamping, embossing, passage of a ribbon through a pair of meshed gears or the like. In providing the thermal mismatch compensation of the present invention, the formation of the bus corrugations may be coordinated to the dimensioning of the collection grid network. Referring to FIG. 1, a conventional grid network will include a plurality of relatively thin, electro-conductive grid lines 20, having a defined inter-grid spacing "d." In the region of the grid lines, here illustrated between X and Y, the spacing between respective peaks and valleys for the bus is an integral multiple of the respective inter-grid spacing. That is, the distance between respective peaks or valleys for the corrugated bus is $\approx$nd where n is an integer. In FIG. 1, the inter-valley spacing of the corrugations is equal to the respective intergrid spacing (N=1). In the subsequent affixing of the bus to the solar cell (to be detailed hereinafter) the lowermost region of each corrugation valley 13 will electrically contact a grid line. Between each contacting region there will be at least one corrugation cycle.

The one or more corrugation cycles between grid securing points provides the thermal expansion compensation of the present invention. Accordingly, in FIG. 1, the corrugated bus 10 having an inter-peak and inter-valley spacing about equal to the respective inter-grid spacing is electrically connected and physically secured to grid lines 20 at the lowermost region of the corrugation valleys 13. In a typical silicon solar cell, grid lines 20 comprise conventional lead-tin solder. For such cells, a preferred method for connecting the bus to the grid network includes coating the bus with a layer of solder, generally referred to as tinning the bus. The regions of the bus which will contact the grid are necessarily coasted, however, coating the entire bus with a relatively thin layer of solder both inhibits oxidation of the bus metal and permits the coating process to be performed prior to forming the corrugations in the bus. The solder coated corrugated bus is then secured to the grid network by sufficiently heating the solder coated bus at least in the corrugation valley region which will contact the grid lines to melt and fuse the grid and bus solder.

Figure 1B:
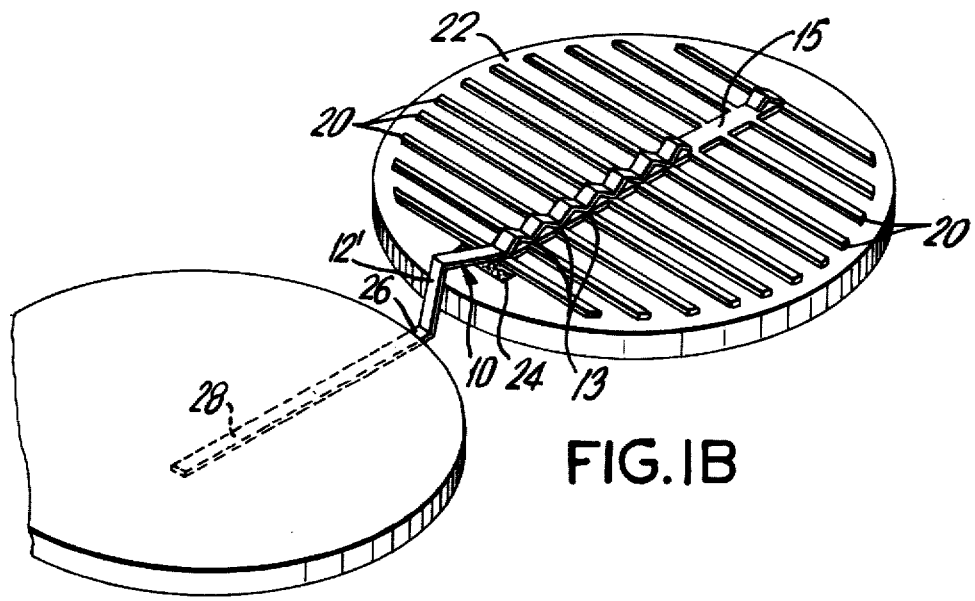
FIG. 1B is a view in perspective of a solar cell having a corrugated bus and an underlying conventional solder plated bus, the corrugated bus being here shown as segmented to allow viewing of the underlying bus.

Alternatively, as shown in FIG. 1B there may be provided on the surface of the solar cell a continuous bus pattern 15 having a minimal solder thickness and about equal to or smaller in width than corrugated bus 10 and formed at the same time as the grid pattern. The solder thickness can conveniently be decreased, for example, by raising the temperature of the solder in the solder pot before the wafer is solder-dipped. This makes the liquid solder more fluid, and less solder adheres to the wafer when it is withdrawn from the molten bath. The copper bus is then attached to the previously formed solder bus pattern at suitable intervals, (not necessarily equal to n x d) so that the series resistance of the solder bus pattern does not inhibit the performance of the solar cell, whereas in the absence of the copper bus, the output of the solar cell would be substantially decreased. For this embodiment, the width of the copper bus will generally be equal to, or somewhat greater than the width of the underlying solder bus pattern. Because of surface tension forces, the copper will tend to be centered over the underlying solder bus pattern during the attachment step when the solder is temporarily molten.

In a preferred embodiment, expansion mismatch is minimized by limiting contact between a copper bus and the silicon body to less than about 0.01 in.$^2$. A further preferred embodiment utilizes copper foil ranging in thickness from about 0.002" to about 0.005" and having a corrugation peak to valley distance at least two times the thickness of the copper foil thickness.

Figure 5:
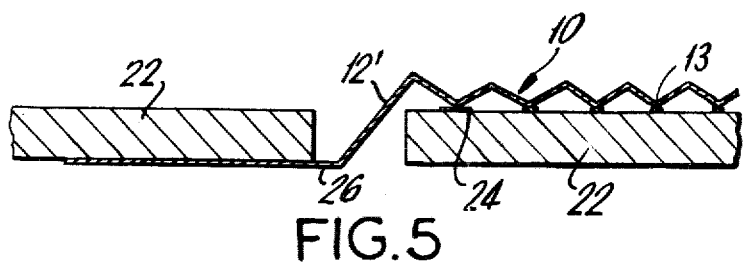
FIG. 5 is an exploded section view of a portion of a solar cell having a corrugated bus.

Conventional silicon solar cells employ an etch ring along the outer diameter region of the photo-active surface of the cell. This region typically serves as an electrical boundary between the photo-active region and the outer diameter edge of the cell which is usually work damaged during the cell processing. In FIG. 1 this region is shown at 22. Bus 10 includes an extended corrugation cycle 12' which crosses but does not electrically contact etched region 22. In a preferred embodiment, an outer diameter bus securing pad 24, similar in composition to grid level lines 20 facilitates the firm securing of the bus to the outer diameter portion of the cell surface. Also in a preferred embodiment, bus 10 includes an inter cell connection tab region 26 which provides electrical interconnection means between solar cells. The interconnect tab may be secured directly to the electrode of the next solar cell as illustrated in phantom at 28. Referring momentarily to FIG. 5, there is shown a segmented view of solar cells 22, 22, having a corrugated bus 10 having an extended corrugation cycle 12' and interconnect tab region 26. Conventional soldering of the interconnect tab region to the next cell provides both electrical and structural connection between the cells.

Figure 2:
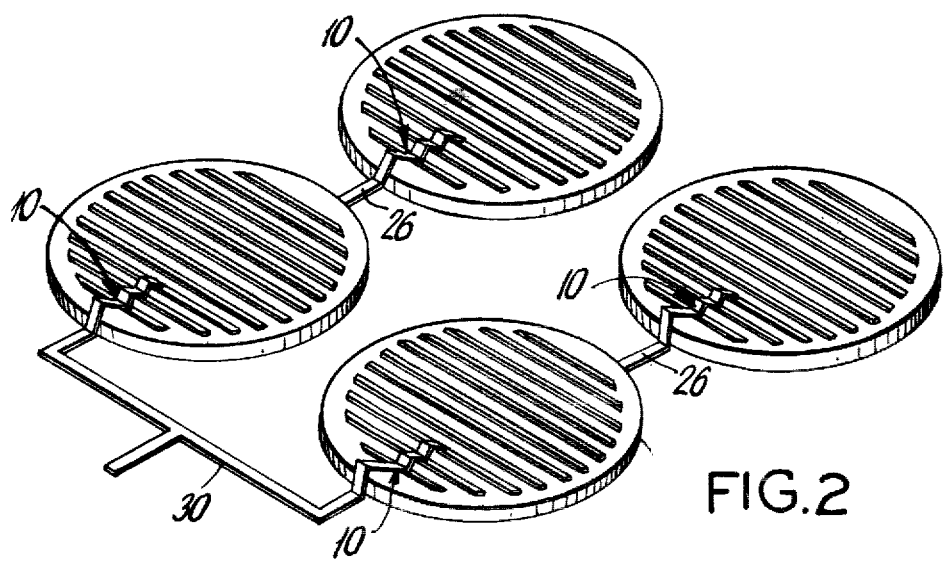
FIG. 2 is a view in perspective of several solar cells coupled in series/parallel arrangement utilizing the bus of the present invention.

The bus configuration of the present invention is of further advantage in that it readily facilitates the electroding, inter-cell wiring and assembly of solar panels. Typically, a plurality of solar cells is coupled in series and series/parallel electrical arrangements to provide the desired current and voltage output. As shown in FIG. 2 the bus 10 may include parallel interconnect tab 30. An array of series and parallel connections may be preselected and affixed to the solar cells, facilitating mechanization of the process.

Figure 3:
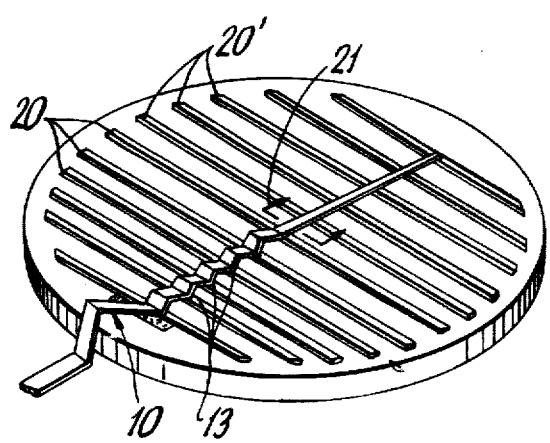
FIG. 3 is a view in perspective of a solar cell having a corrugated bus which extends a portion of the diameter of a solar cell.

Referring to FIG. 3, there is shown a further embodiment of the present invention. Corrugated bus 10' extends only a portion of the distance across the solar cell surface, coupled to grid lines 20'. The remaining length of the bus, shown as 21, may comprise the same material and process used to form grid lines 20 to which bus 21 makes electrical contact or in an alternate embodiment may combine the metallic bus without the aforedescribed corrugations.

Figure 4:
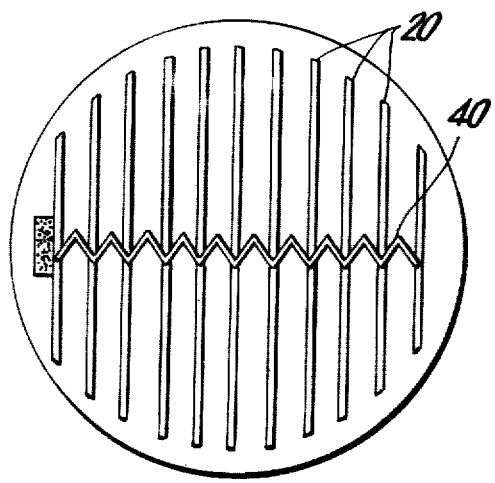
FIG. 4 is a top view of a solar cell having a corrugated bus whose corrugations are perpendicular to the face of the solar cell.

A further embodiment of the present invention includes a bus having corrugations generally perpendicular to the surface of the solar cell as illustrated in FIG. 4. Accordingly, in FIG. 4, bus 40 includes corrugations which are generally perpendicular to the plane of the solar cell's surface and having at least 1 corrugation cycle between each grid line 20. This embodiment provides a constant height bus while maintaining the desirable properties of the corrugated bus described heretofore. In this embodiment, a defined spacer region above the surface of the solar cell facilitates control of the positioning of a superstrate as described earlier in the disclosure. In the other embodiments described heretofore, spacer height is controlled by the defined height between corrugation peaks and valleys.

Figure 6:
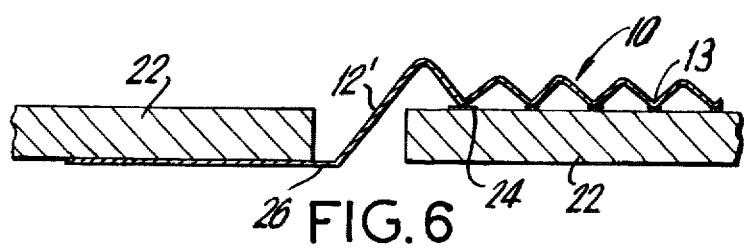
FIG. 6 is an exploded section view of a further embodiment of the corrugated bus solar cell of the present invention.

Although the invention has heretofore been generally described as having corrugations in the form of pleats or folds in the bus, the present invention contemplates the use of alternate geometric configurations in forming the corrugations provided they permit the requisite movement between securing points to the solar cell body. As illustrated in FIG. 6, the bus 10 may, in the formation of the corrugations have rounded or curvature formed peaks and valleys.

Those of the art readily recognize that the geometry or the positioning of the corrugated bus on the cell's surface may be altered. For example, since the current carrying requirment is an integral of the area from which the bus collects current, the width of the bus may be tapered to allow more exposure of the photo-active solar cell region. Furthermore, the geometry of the corrugations themselves may be varied to facilitate the process used to form the corrugations, to coordinate their integration into the grid network or any such particular needs of the user of this invention. The pattern and geometry of the grid network may similarly be altered to facilitate incorporation of the corrugated bus. Securing pads in the form of a widened grid region may be used to assure alignment and connection between the grid and the bus. All such variations in the geometry of positioning of the bus and associated grid network are clearly to be considered within the scope of the present invention.

The corrugated bus may further be used in conjunction with (or in parallel to) a conventional bus, electrical and securing contact between the busses being made at a plurality of points along their length.

What is claimed is:

1. A solar cell having a prefabricated conductive bus for providing electrical contact to a major surface thereof, said bus comprising a strip of electrically conductive metal foil having corrugations extending for a majority of its major length wherein physical and electrical contact between the surface of the solar cell and the bus occurs at a plurality of positions along the major length of the bus.

2. The solar cell of claim 1 wherein said metal foil comprises copper having a layer of solder thereon.

3. The solar cell of claim 2 wherein the peak to valley distance of the corrugation is at least two times the thickness of the copper foil.

4. The solar cell of claim 2 wherein said foil has a thickness of about 0.002 inches to about 0.005 inches.

5. The solar cell of claim 2 wherein said corrugation extends throughout the length of the bus.

6. The solar cell of claim 2 including a plurality of grid lines extending across a major portion of said surface of the solar cell, wherein said corrugations comprising parallel grooves and ridges contact said surface of said solar cell at bottom portions of said grooves.

7. The solar cell of claim 6 wherein said parallel ridges and grooves are spaced at intervals which are an integer multiple of the distance between adjacent grid lines.

8. The solar cell of claim 1 wherein said bus is essentially rectangular in shape.

9. A photovoltaic solar energy converter comprising: a solar cell having a current collection conductive grid on at least a major surface of said solar cell, said grid including a plurality of essentially parallel grid lines, spaced a distance d from one another, said grid lines comprising a solderable material; a corrugated conductive bus comprising solder coated metal foil having a plurality of essentially parallel grooves and ridges, said bus extending essentially perpendicular to said grid lines and extending across a major distance of said solar cell surface and further having an inter-groove spacing of d×n where n is a positive integer, said bus electrically contacting and physically secured to said grid lines at a bottom portion of said grooves.

10. The solar cell of claim 8 wherein said solar cell includes a circumferential etch ring and said corrugated bus includes at least one extended ridge portion which crosses but does not contact said etch ring.

11. The solar cell of claim 10 wherein said bus tapers in width having an increasing width toward said circumferential etch ring.

12. The solar cell of claim 10 wherein said metal foil has a tapered thickness, increasing in thickness toward said etch ring.

13. The solar cell of claim 9 wherein said metal foil has a thickness of about 0.002" to 0.005".

14. The solar cell of claim 1 or 8 wherein said solar cell comprises a silicon solar cell.

15. The solar cell of claim 14 wherein said silicon solar cell comprises a single crystal silicon solar cell.

16. A photovoltaic solar energy converter comprising:
a solar cell having a current collection grid on at least one surface of said solar cell, said grid including a plurality of essentially parallel grid lines, extending a major distance across said solar cell surface and spaced a distance d from one another, said grid lines comprising a solderable electrically conductive material; a corrugated conductive bus comprising a ductile metal of high electro-conductivity, said corrugations being perpendicular to the surface of said solar cell, said corrugated bus electrically contacting and physically secured to each of said grid lines.

17. A photovoltaic solar energy converter comprising a solar cell having a current collection grid and bus patterned on at least one surface of the solar cell and at least one corrugated metal bus extending along said bus and attached thereto at a plurality of intervals.

18. A photovoltaic solar energy converter as set forth in claim 17 in which the corrugated metal bus is of constant width.

19. A photovoltaic solar energy converter as set forth in claim 18 in which the bus is tapered.

20. A photovoltaic energy converter as set forth in claim 16 or 17 in which the bus extends beyond at least one edge of the solar converter and serves as interconnection means to adjacent converters.

21. The photovoltaic solar energy converter of claim 16 or 17 wherein said bus extends a defined height above the surface of said cell to function as a spacer between said solar cell and a superstrate.

22. The photovoltaic solar energy converter of claim 16 or 15 wherein said solar cell comprises a silicon solar cell.

23. The photovoltaic solar energy converter of claim 22 wherein said silicon solar cell comprises a single crystal solar cell.

* * * * *